United States Patent
Iida et al.

(10) Patent No.: US 7,450,964 B2
(45) Date of Patent: Nov. 11, 2008

(54) SEMICONDUCTOR INTEGRATED CIRCUIT, CHECKING DEVICE AND METHOD OF CHECKING SEMICONDUCTOR INTEGRATED CIRCUIT

(75) Inventors: Izumi Iida, Nagano (JP); Makoto Inoguchi, Tokyo (JP)

(73) Assignee: Seiko Epson Corporation (JP)

( * ) Notice: Subject to any disclaimer, the term of this patent is extended or adjusted under 35 U.S.C. 154(b) by 269 days.

(21) Appl. No.: 11/168,073

(22) Filed: Jun. 28, 2005

(65) Prior Publication Data

US 2006/0009252 A1  Jan. 12, 2006

(30) Foreign Application Priority Data

Jul. 12, 2004  (JP) .............................. 2004-204579

(51) Int. Cl.
*H04B 1/38* (2006.01)

(52) U.S. Cl. .................... 455/557; 455/569; 455/556.1; 455/100

(58) Field of Classification Search ................. 300/535; 455/569, 556.1, 100, 96, 97

See application file for complete search history.

(56) References Cited

U.S. PATENT DOCUMENTS

| 2003/0152111 A1 | 8/2003 | Hiraoka |
| 2003/0166409 A1* | 9/2003 | Ishii ........................... 455/569 |
| 2005/0015260 A1* | 1/2005 | Hung et al. ................. 704/500 |

FOREIGN PATENT DOCUMENTS

| JP | 11-101858 | 4/1999 |
| JP | 2003-043118 | 2/2003 |
| JP | 2003-057300 | 2/2003 |

OTHER PUBLICATIONS

Communication from Japanese Patent Office re: related application.
International Search Report for PCT/JP2005/013111 dated Oct. 3, 2005 (ISA/JP).

* cited by examiner

*Primary Examiner*—David Q Nguyen
(74) *Attorney, Agent, or Firm*—Harness, Dickey & Pierce, P.L.C.

(57) ABSTRACT

A semiconductor integrated circuit including: a circuit function section; a bus connected to the circuit function section; an information fetch register for fetching data flowing over the bus; and a radio communicating circuit for wirelessly transmitting the data fetched into the information fetch register.

3 Claims, 7 Drawing Sheets

SEMICONDUCTOR INTEGRATED CIRCUIT, CHECKING DEVICE AND METHOD OF CHECKING SEMICONDUCTOR INTEGRATED CIRCUIT

BACKGROUND OF THE INVENTION

1. Technical Field

The present invention relates to a semiconductor integrated circuit, a checking device and a method of checking the semiconductor integrated circuit, and particularly, is suitable for an application to a method of checking an ASIC (Application Specific Integrated Circuit).

2. Related Art

In a method of checking a semiconductor integrated circuit according to the related art, an IC chip attached onto a circuit board is tested by using a JTAG (Joint Test Action Group) test port. The JTAG standard is defined by an IEEE 1149.1, "IEEE Standard Test Access Port and Boundary—Scan Architecture". The JTAG test port has the function of outputting information about an internal register or an input/output bus.

For example, Japanese Patent Application Publication 2003-57300 discloses a method of incorporating a checking circuit into an integrated circuit and receiving, through a receiving section, an electromagnetic wave discharged from the feeding and transmitting/receiving antenna of a checking device, thereby generating the driving power of the checking circuit in order to carry out a check without supplying the driving power to a circuit or a board. Moreover, it is also possible to receive a check control procedure from the checking device in a non-contact mode in the same manner and to cause a control logic to control an analog SW, a D/A circuit and an A/D circuit in accordance with the received control procedure to check a circuit through a checking wiring, thereby transmitting the result of the check to the checking device through an encoder and a transmitting section.

In the JTAG test port, however, information is exchanged through a serial communication of approximately 10 Mbps. For this reason, the JTAG standard has a problem in that it is impossible to handle a sufficient information amount for monitoring information about a register or a bus connected to a CPU subjected to multibit processing.

Moreover, there is a problem in that a package size is increased when a pin for outputting the signal of an internal bus in an ASIC to the outside of an IC package is provided in order to monitor the signal of the internal bus in the ASIC. Furthermore, there is also a problem in that a noise might be added to the signal of the internal bus, thereby causing a malfunction.

In addition, the method disclosed in Japanese Patent Application Publication 2003-57300 serves to receive a checking procedure from the outside to check the state of a circuit and to transmit the result of the check to the outside, and has a problem in that the check cannot be carried out in a procedure other than a predetermined procedure.

SUMMARY

Therefore, an advantage of the invention is to provide a semiconductor integrated circuit, a checking device and a method of checking the semiconductor integrated circuit which can specify a checking procedure and can increase the amount of information that can be monitored during a check.

In order to solve the problems, a semiconductor integrated circuit according to an aspect of the invention comprises a circuit function section, a bus connected to the circuit function section, an information fetch register for fetching data flowing over the bus, and a radio communicating circuit for wirelessly transmitting the data fetched into the information fetch register.

Consequently, it is possible to fetch the data flowing over the bus into the information fetch register and to then wirelessly transmit the same data to the outside. Therefore, it is possible to monitor a large amount of information in real time and to carry out the functional test of an ASIC in which a circuit having a plurality of functions and including a CPU is integrated. In addition, it is not necessary to provide a pin for outputting the signal of an internal bus in the ASIC to the outside of an IC package. Thus, it is possible to suppress an increase in a package size.

Moreover, a semiconductor integrated circuit according to an aspect of the invention comprises a CPU, an information fetch register for fetching data stored in an internal register of the CPU, and a radio communicating circuit for wirelessly transmitting the data fetched into the information fetch register.

Consequently, it is possible to cause the information fetch register to fetch the internal data of the CPU. Thus, it is possible to monitor the internal data of the CPU.

Furthermore, a semiconductor integrated circuit according to an aspect of the invention comprises a circuit function section, a data latch section provided in the circuit function section, an information fetch register for fetching data latched by the data latch section, and a radio communicating circuit for wirelessly transmitting the data fetched into the information fetch register.

Consequently, it is possible to cause the information fetch register to directly fetch the data of a specific circuit function section. Thus, it is possible to continuously monitor the operation of the specific circuit function section.

In accordance with an embodiment of the invention, moreover, it is preferable that the radio communicating circuit should include a control information receiving section for receiving control information to give an instruction for fetching data into the information fetch register.

By specifying data to be monitored from the outside, consequently, it is possible to cause the information fetch register to fetch only the specified data. Thus, it is possible to efficiently carry out the functional test of an ASIC in which a circuit having a plurality of functions and including a CPU is integrated.

A semiconductor integrated circuit according to an aspect of the invention further comprises a wire communicating section for transmitting, by a wire, additional information accompanying a radio communication to be carried out in the radio communicating circuit.

Consequently, it is possible to wirelessly transmit data fetched into the information fetch register to the outside and to send authentication information in a radio communication by a wire. Therefore, it is possible to monitor a large amount of information in real time while maintaining a security in the radio communication.

Moreover, a checking device according to an aspect of the invention comprises a radio communicating section for communicating with a semiconductor integrated circuit, and a checking section for checking the semiconductor integrated circuit based on data flowing over a bus of the semiconductor integrated circuit which are received by the radio communicating section or data stored in an internal register.

Consequently, it is possible to wirelessly fetch, into the checking device, the data flowing over the bus of the semiconductor integrated circuit or the data stored in the internal register and to carry out the functional test of an ASIC in which a circuit having a plurality of functions and including a CPU is integrated.

Furthermore, a method of checking a semiconductor integrated circuit according to an aspect of the invention comprises the steps of transmitting control information for giving an instruction for fetching data into an information fetch register, causing the information fetch register to fetch data flowing over a bus of the semiconductor integrated circuit based on the control information, and wirelessly transmitting the data fetched into the information fetch register.

Consequently, it is possible to cause the information fetch register to fetch the specified data and to then wirelessly transmit the same data to the outside. Therefore, it is possible to efficiently monitor a large amount of information in real time and to carry out the functional test of an ASIC in which a circuit having a plurality of functions and including a CPU is integrated. In addition, it is not necessary to provide a pin for outputting the signal of the internal bus of the ASIC to the outside of an IC package. Thus, it is possible to suppress an increase in a package size.

BRIEF DESCRIPTION OF THE DRAWINGS

The invention will be described with reference to the accompanying drawings, wherein like numbers reference like elements, and wherein.

DESCRIPTION OF THE EMBODIMENTS

A semiconductor integrated circuit and a checking method thereof according to embodiments of the invention will be described below with reference to the drawings.

Figure 1:
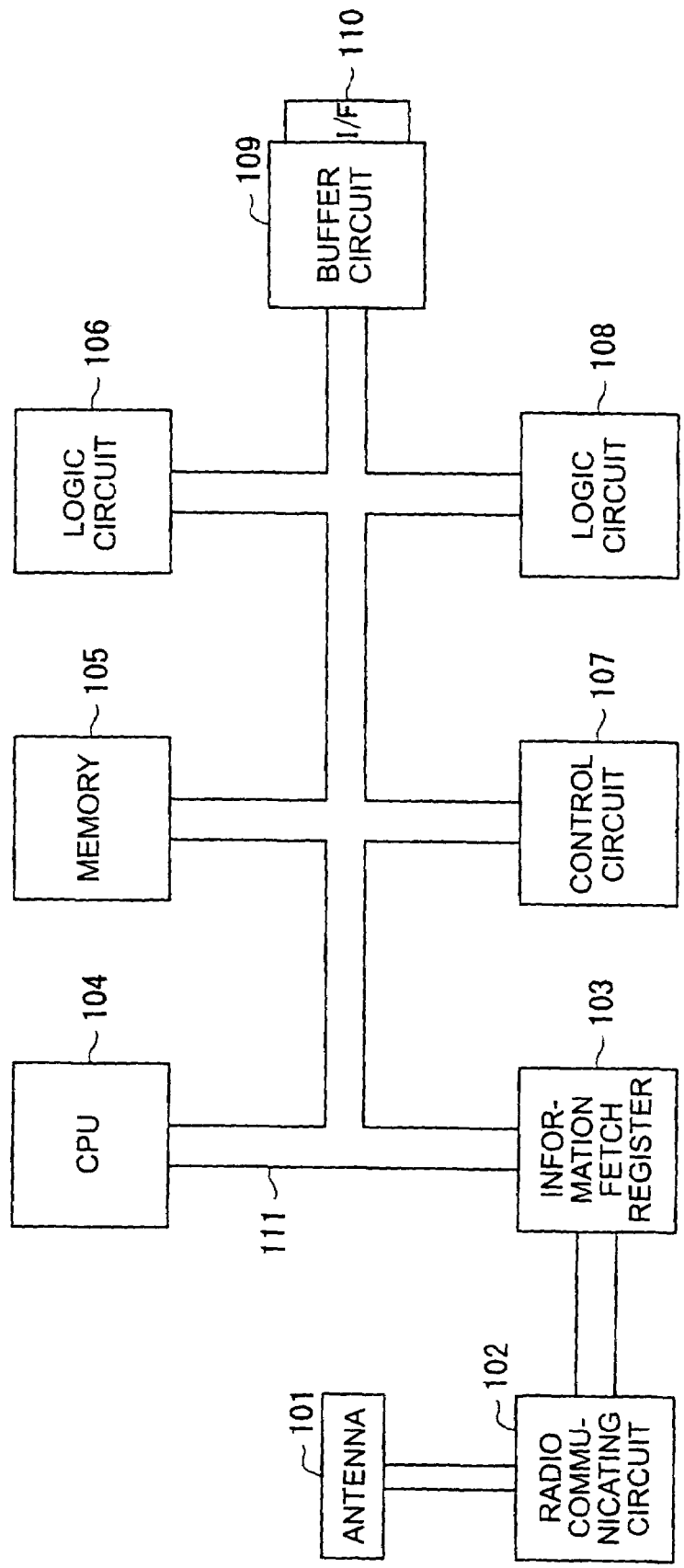
FIG. 1 is a block diagram showing the structure of a semiconductor integrated circuit according to a first embodiment of the invention.

FIG. 1 is a block diagram showing the schematic structure of a semiconductor integrated circuit according to a first embodiment of the invention.

In FIG. 1, a CPU 104, a memory 105, logic circuits 106 and 108, a control circuit 107 and a buffer circuit 109 are connected to each other through a bus 111. An information fetch register 103 for fetching data flowing over the bus 111 is connected to the bus 111, and a radio communicating circuit 102 for wirelessly transmitting data fetched into the information fetch register 103 is connected to the information fetch register 103. The radio communicating circuit 102 is provided with an antenna 101 for transmitting/receiving a radio wave. Moreover, the buffer circuit 109 is provided with an external interface 110.

The CPU 104, the memory 105, the logic circuits 106 and 108, the control circuit 107 and the buffer circuit 109 can be set to be the components of a circuit function section in an ASIC. Moreover, the CPU 104, the memory 105, the logic circuits 106 and 108, the control circuit 107, the buffer circuit 109, the antenna 101, the radio communicating circuit 102 and the information fetch register 103 can be mounted on the same semiconductor chip.

When data flowing over the bus 111 are fetched into the information fetch register 103, the radio communicating circuit 102 transmits the data fetched into the information fetch register 103 to the outside through the antenna 101. The fetching of the data into the information fetch register 103 and the discharge of the data from the radio communicating circuit 102 can follow the technique of JTAG.

Consequently, it is possible to monitor a large amount of data flowing over the bus 111 in real time. Consequently, it is possible to carry out the functional test of the ASIC in which a circuit having a plurality of functions and including the CPU 104 is integrated. In addition, it is not necessary to provide a pin for outputting the signal of the internal bus 111 of the ASIC to the outside of an IC package. Consequently, it is possible to suppress an increase in a package size.

By wirelessly transmitting the data flowing over the bus 111, it is not necessary to carry out probing over a data line. Therefore, it is possible to prevent the semiconductor integrated circuit from causing a defective operation with the distortion of a waveform due to the parasitic capacitance of a probe. Thus, it is possible to stably check the semiconductor integrated circuit.

The radio communicating circuit 102 may receive control information for giving an instruction for fetching data into the information fetch register 103 and may transmit only the specified data to the outside. For example, a user may select data to be output to the radio communicating circuit 102, for example, "data accessed to the logic circuit 106" and the information fetch register 103 may decode data on the bus 111 to fetch only the data which are selected.

Moreover, the radio communicating circuit 102 can carry out a broadband short-distance radio communication such as UWB (Ultra Wide Band) and can maintain an information transmitting speed of approximately several hundreds Mbps. Therefore, high-speed data flowing over the internal bus 111 of the ASIC can be monitored in real time.

Figure 2:
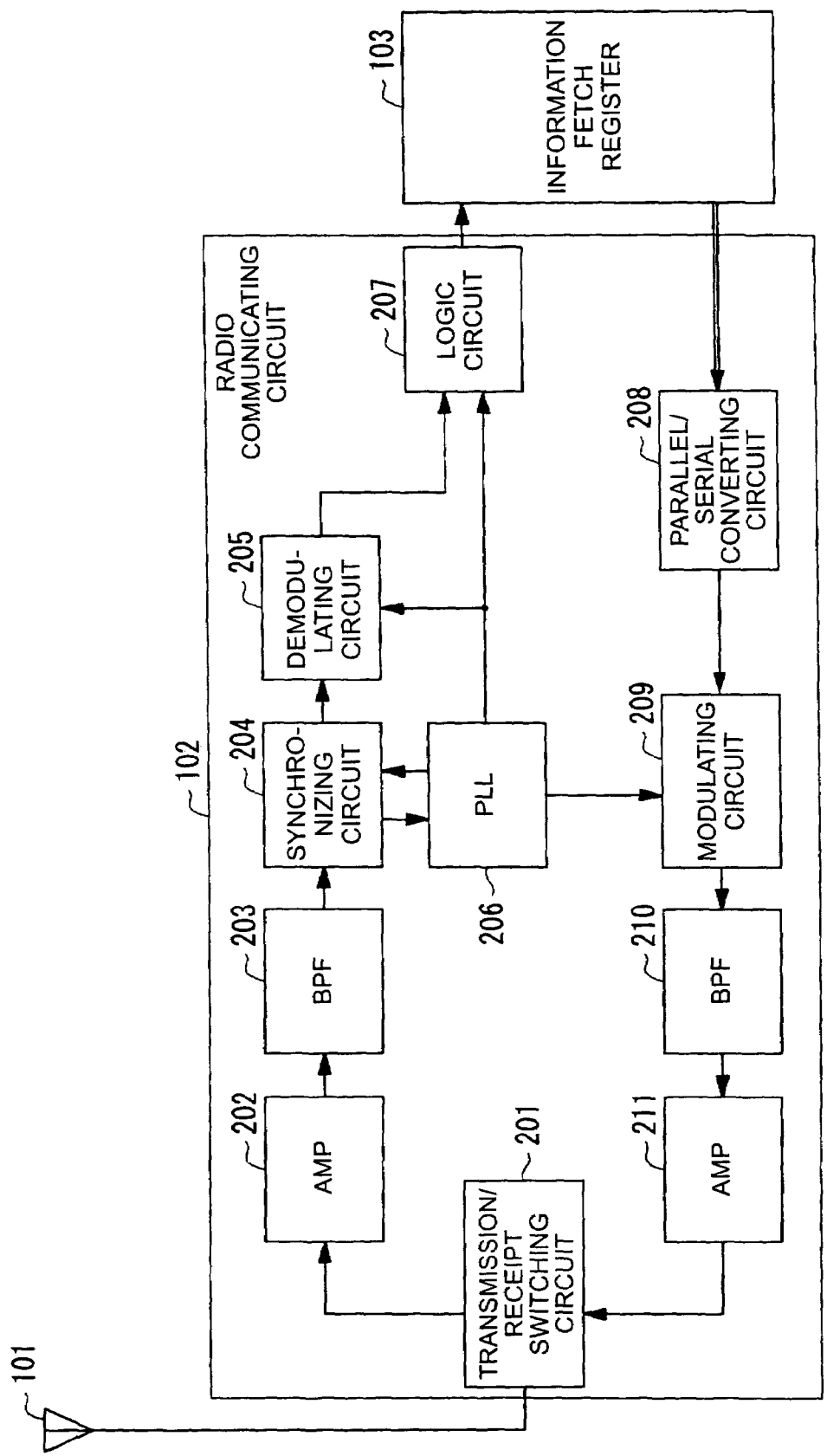
FIG. 2 is a block diagram showing the schematic structure of a radio communicating circuit 102 in FIG. 1.

FIG. 2 is a block diagram showing the schematic structure of the radio communicating circuit 102 in FIG. 1.

In FIG. 2, in the case in which data are to be received by the radio communicating circuit 102, a transmission/receipt switching circuit 201 switches a connection to the antenna 101 toward an amplifier 202 side. After a signal received through the antenna 101 is amplified by the amplifier 202, a disturbance wave in an unnecessary band is removed in a band-pass filter 203 and the signal is input to a synchronizing circuit 204. Then, a preamble in a receiving signal packet is detected by the synchronizing circuit 204 and a necessary synchronous timing and clock for a demodulation is generated in cooperation with a PLL circuit 206. Thereafter, a demodulating circuit 205 demodulates the received data by using the outputs of the synchronizing circuit 204 and the PLL circuit 206 upon receipt of a receiving signal. A logic circuit 207 generates a clock signal in timing with the received data which are demodulated, and outputs the clock signal to the information fetch register 103. Consequently, the information fetch register 103 can be caused to fetch the data.

On the other hand, in the case in which the data are to be transmitted in the radio communicating circuit 102, the transmission/receipt switching circuit 201 switches the connection to the antenna 101 toward an amplifier 211 side. Then, a parallel/serial converting circuit 208 converts parallel data output from the information fetch register 103 into serial data and outputs the serial data to a modulating circuit 209. The modulating circuit 209 modulates a carrier frequency generated in the PLL circuit 206 with the data received from the parallel/serial converting circuit 208. Subsequently, a modulation signal is transmitted to the antenna 101 through a band-pass filter 210 and the amplifier 211 and is thereafter transmitted to the outside through the antenna 101.

By causing the radio communicating circuit 102 to have a two-way communicating function, it is also possible to wirelessly input a command to the CPU 104. By wirelessly writing a program to the memory 105 from the outside, it is possible to cause the CPU 104 to execute the program written to the memory 105.

Figure 3:
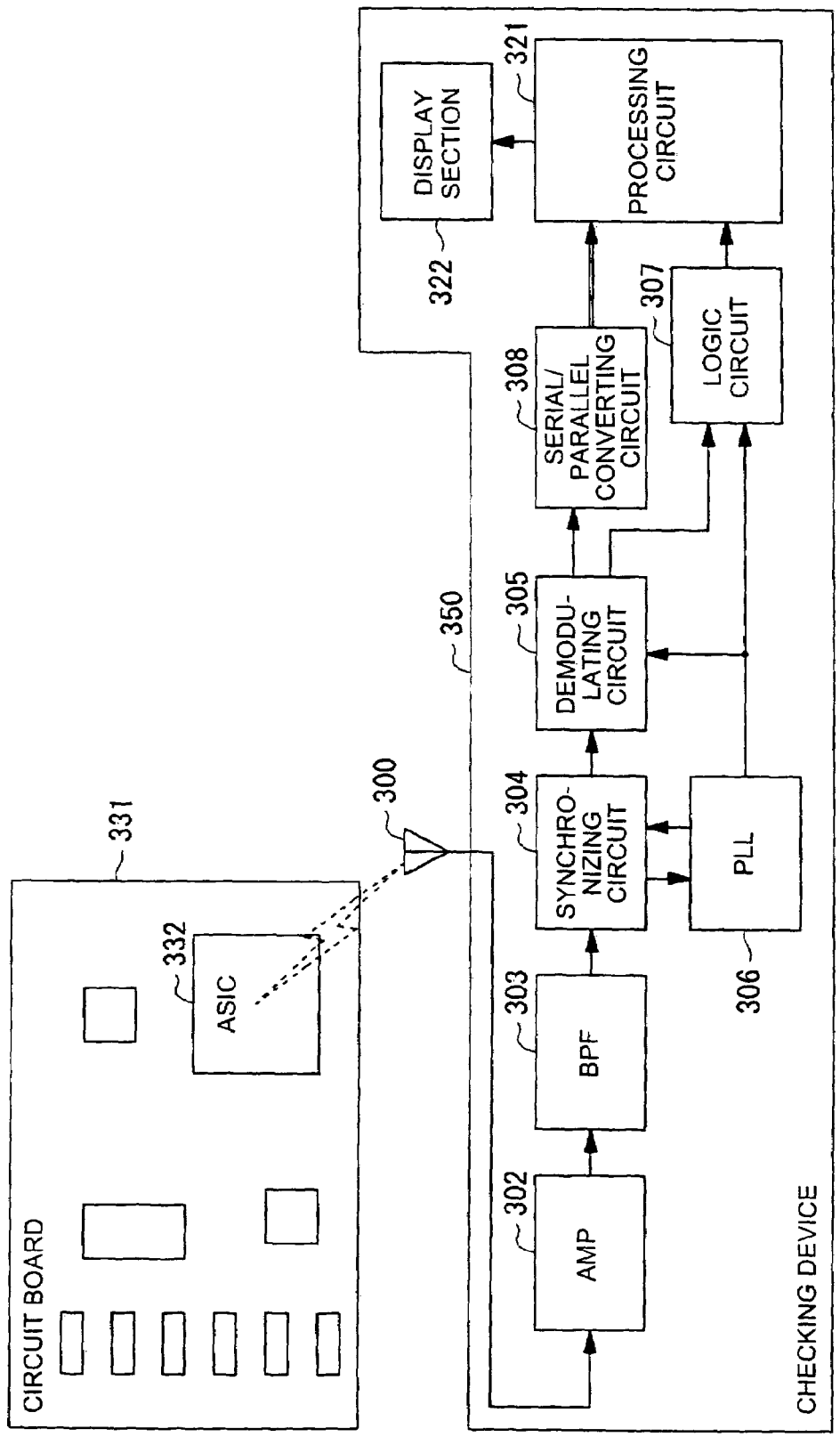
FIG. 3 is a block diagram showing the structure of a checking device in a semiconductor integrated circuit according to a second embodiment.

FIG. 3 is a block diagram showing the schematic structure of a checking device 350 in a semiconductor integrated circuit according to a second embodiment of the invention.

In FIG. 3, an ASIC 332 is mounted on a circuit board 331. The ASIC 332 includes the antenna 101, the radio communicating circuit 102 and the information fetch register 103 in FIG. 1.

In the case in which the checking device 350 is to monitor data in the ASIC 332, data transmitted from the ASIC 332 are received by an antenna 300. Then, a signal received through the antenna 300 is amplified by an amplifier 302, and a disturbance wave in an unnecessary band is then removed in a band-pass filter 303 and the signal is input to a synchronizing circuit 304. Thereafter, a preamble in the receiving signal is detected in the synchronizing circuit 304 and a necessary synchronous timing and clock for a demodulation is generated in cooperation with a PLL circuit 306. A demodulating circuit 305 demodulates the receiving signal by using the outputs of the synchronizing circuit 304 and the PLL circuit 306 upon receipt of the receiving signal, and thereafter outputs demodulation data to a serial/parallel converting circuit 308. Subsequently, the serial/parallel converting circuit 308 outputs the serial/parallel converted data to a processing circuit 321. Moreover, a logic circuit 307 generates a clock signal in timing with the received data which are demodulated by the demodulating circuit 305, and outputs the clock signal to the processing circuit 321. Then, the processing circuit 321 can cause a display section 322 to display the serial/parallel converted data in real time in timing with the output of the logic circuit 307 upon receipt of the same data from the serial/parallel converting circuit 308.

Figure 4:
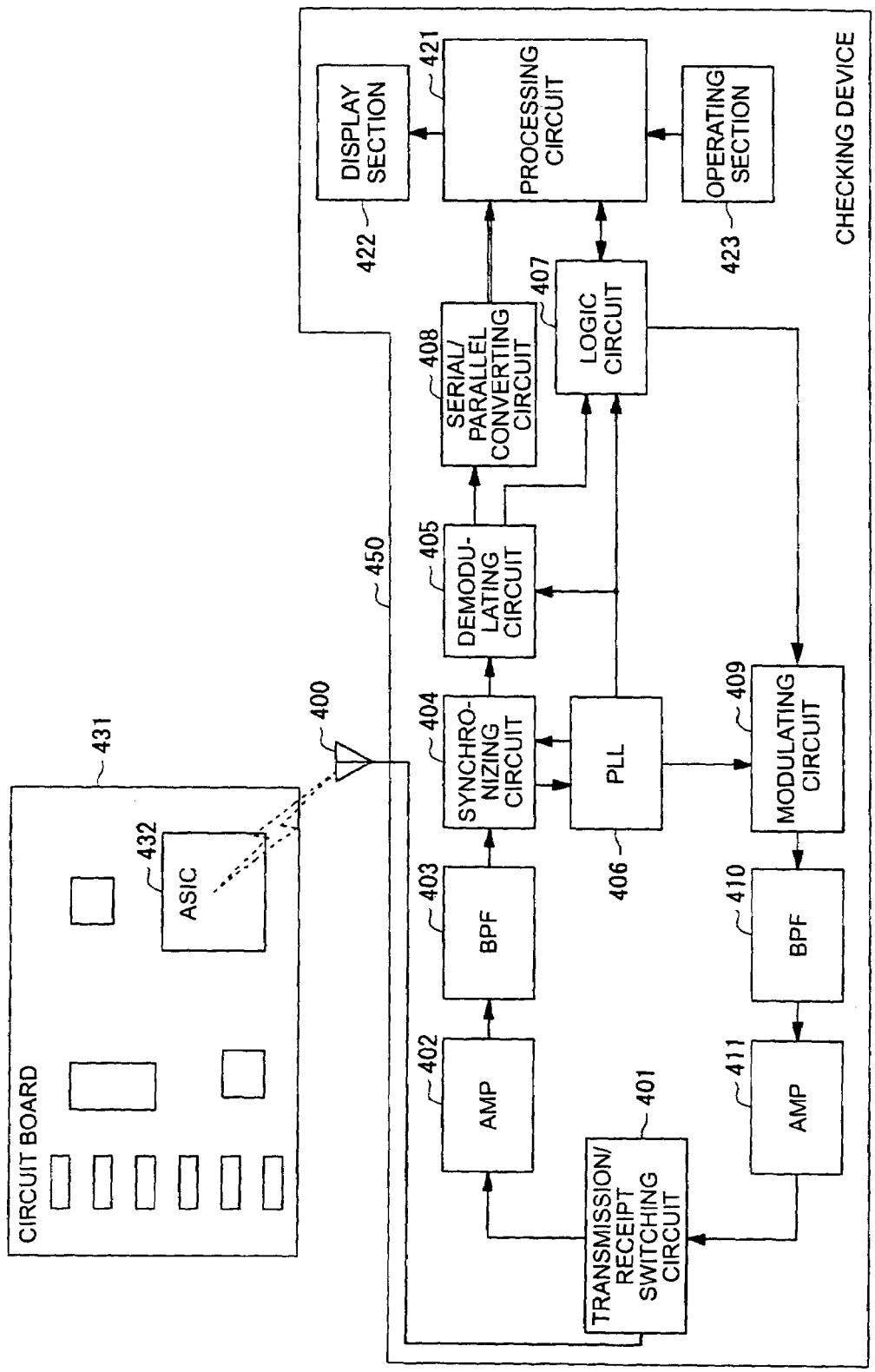
FIG. 4 is a block diagram showing the structure of a checking device in a semiconductor integrated circuit according to a third embodiment.

FIG. 4 is a block diagram showing the schematic structure of a checking device 450 in a semiconductor integrated circuit according to a third embodiment of the invention.

In FIG. 4, an ASIC 432 is mounted on a circuit board 431. The ASIC 432 includes the antenna 101, the radio communicating circuit 102 and the information fetch register 103 in FIG. 1.

In the case in which the checking device 450 is to externally control the ASIC 432, a transmission/receipt switching circuit 401 switches a connection to an antenna 400 toward an amplifier 411 side. When an instruction for fetching data is given in an operating section 423, a processing circuit 421 generates control information for giving the instruction for fetching data and transmits the control information to a logic circuit 407. Then, the logic circuit 407 generates a packet for a wireless transmission upon receipt of the control information from the processing circuit 421, and outputs the packet to a modulating circuit 409. The modulating circuit 409 modulates the data received from the logic circuit 407 at a carrier frequency generated by a PLL circuit 406. Thereafter, a modulation signal is sent to the antenna 400 through a band-pass filter 410 and the amplifier 411, and is transmitted to the outside through the antenna 400.

On the other hand, in the case in which the checking device 450 is to monitor data in the ASIC 432, a transmission/receipt switching circuit 401 switches a connection to the antenna 401 toward an amplifier 402 side. A signal transmitted from the ASIC 432 is received by the antenna 400. Then, the signal received through the antenna 400 is amplified by an amplifier 402, and a disturbance wave in an unnecessary band is then removed in a band-pass filter 403 and the signal is input to a synchronizing circuit 404. Thereafter, a preamble in the receiving signal is detected in the synchronizing circuit 404 and a necessary synchronous timing and clock for a demodulation is generated in cooperation with the PLL circuit 406. A demodulating circuit 405 demodulates the received data by using the outputs of the synchronizing circuit 404 and the PLL circuit 406 upon receipt of the receiving signal, and thereafter outputs the demodulated data to a serial/parallel converting circuit 408. Subsequently, the serial/parallel converting circuit 408 outputs the serial/parallel converted data to the processing circuit 421. Moreover, the logic circuit 407 generates a clock signal in timing with the received data which are demodulated by the demodulating circuit 405, and outputs the clock signal to the processing circuit 421. Then, the processing circuit 421 can cause a display section 422 to display the serial/parallel converted data in real time in timing with the output of the logic circuit 407 upon receipt of the same data from the serial/parallel converting circuit 408.

The method of checking a semiconductor integrated circuit may be used for ascertaining whether the semiconductor integrated circuit is manufactured normally or not, and may be used for checking the quality of the semiconductor integrated circuit. In the development of the semiconductor integrated circuit, alternatively, it is also possible to use the method in order to ascertain whether each circuit function section constituting an ASIC is designed correctly or not.

While the method of checking the ASIC mounted on the circuit board has been described in the embodiments, moreover, it is also possible to accommodate the ASIC in a housing to check the ASIC.

Figure 5:
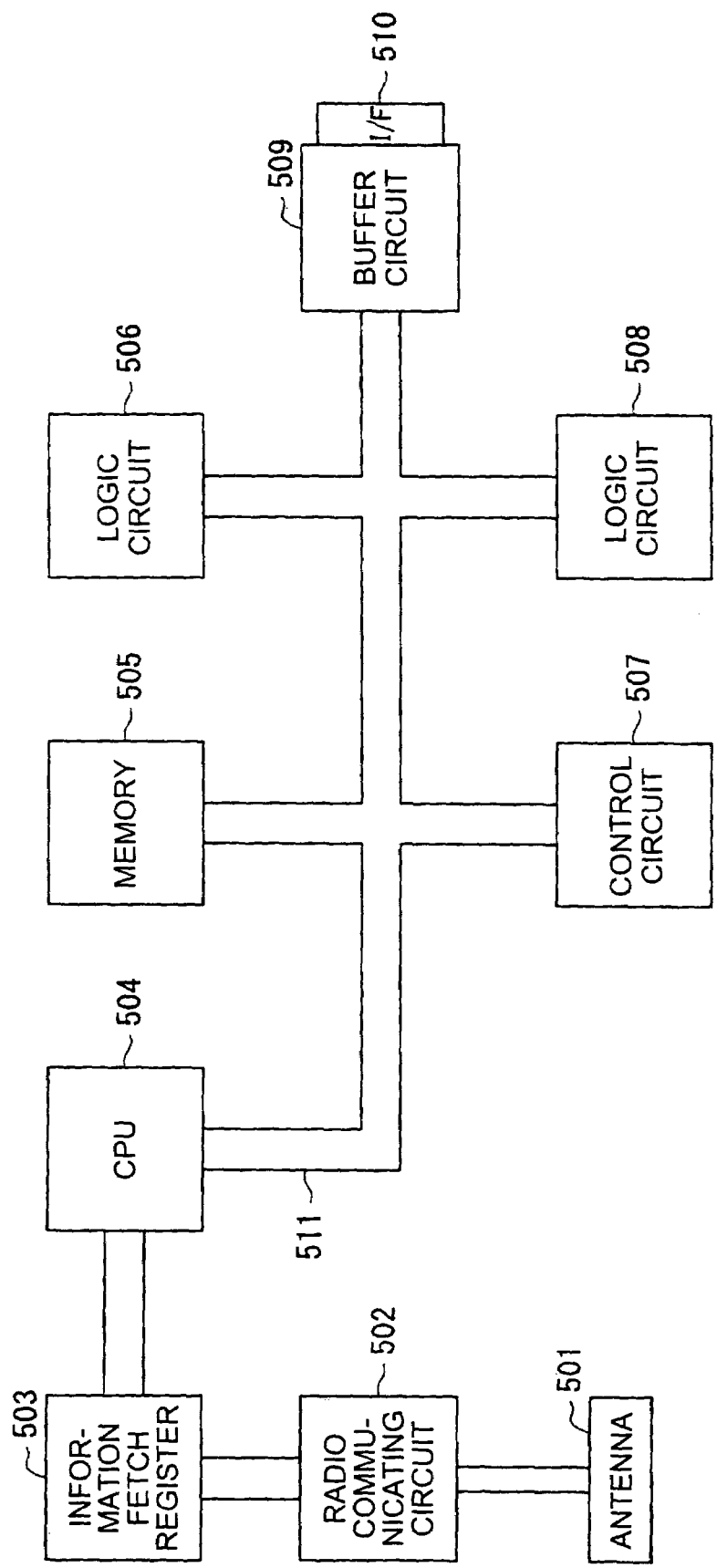
FIG. 5 is a block diagram showing the structure of a semiconductor integrated circuit according to a fourth embodiment of the invention.

FIG. 5 is a block diagram showing the schematic structure of a semiconductor integrated circuit according to a fourth embodiment of the invention.

In FIG. 5, a CPU 504, a memory 505, logic circuits 506 and 508, a control circuit 507 and a buffer circuit 509 are connected to each other through a bus 511. An information fetch register 503 for fetching data stored in the internal register of the CPU 504 is connected to the CPU 504, and a radio communicating circuit 502 for wirelessly transmitting data fetched into the information fetch register 503 is connected to the information fetch register 503. The radio communicating circuit 502 is provided with an antenna 501 for transmitting/receiving a radio wave. Moreover, the buffer circuit 509 is provided with an external interface 510.

When data stored in the internal register of the CPU 504 are fetched into the information fetch register 503, the radio communicating circuit 502 transmits the data fetched into the information fetch register 503 to the outside through the antenna 501.

Consequently, the information fetch register 503 can be caused to fetch the internal data (instruction cache) of the CPU 504. Thus, the internal data of the CPU 504 can be monitored. Therefore, it is also possible to monitor data which cannot be accessed from the bus 511 so that the precision of a check can be enhanced.

Figure 6:
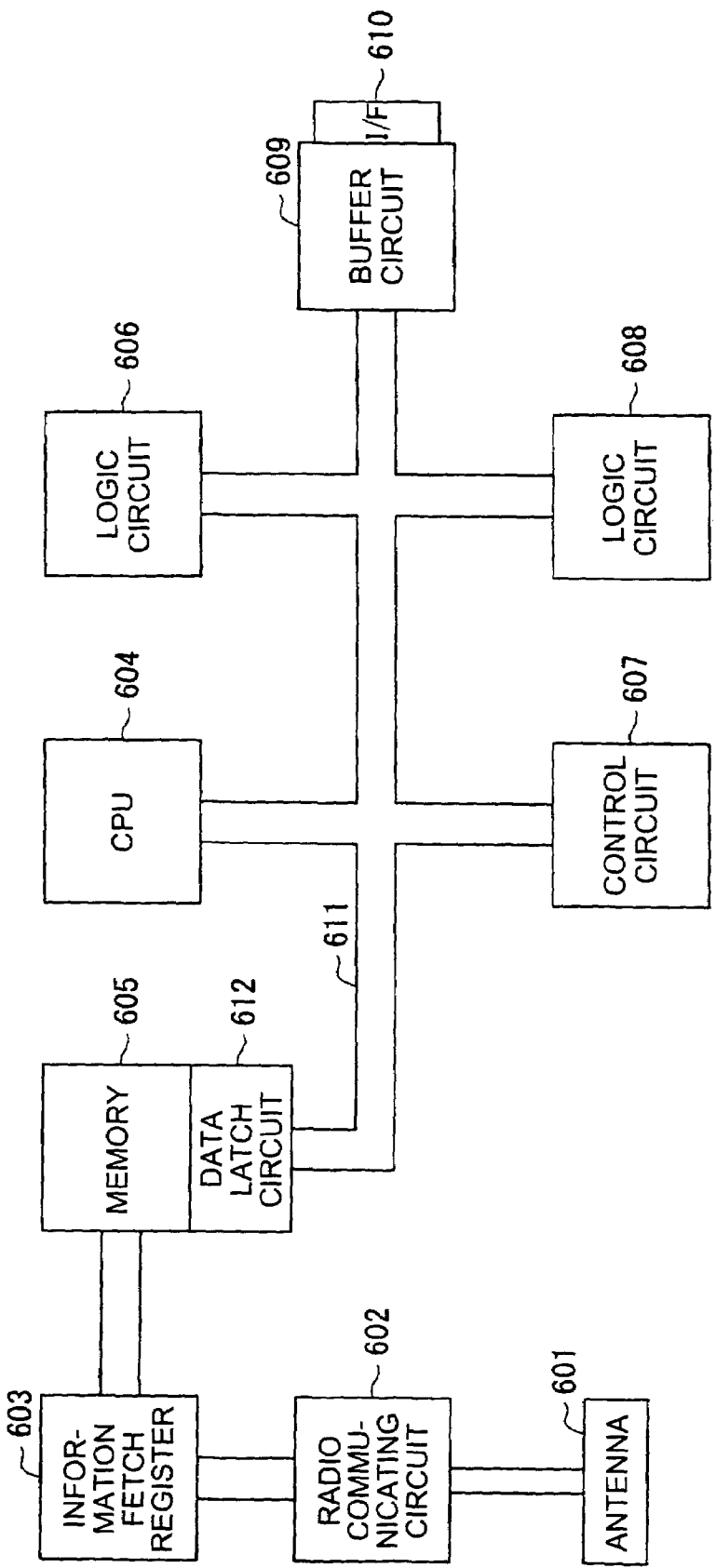
FIG. 6 is a block diagram showing the structure of a semiconductor integrated circuit according to a fifth embodiment of the invention.

FIG. 6 is a block diagram showing the schematic structure of a semiconductor integrated circuit according to a fifth embodiment of the invention.

In FIG. 6, a CPU 604, logic circuits 606 and 608, a control circuit 607 and a buffer circuit 609 are connected to each other through a bus 611. Moreover, a memory 605 is provided with a data latch circuit 612 for latching data to be stored in the memory 605, and the data latch circuit 612 is connected to the bus 611. An information fetch register 603 for fetching the data latched by the data latch circuit 612 is connected to the data latch circuit 612, and a radio communicating circuit 602 for wirelessly transmitting the data fetched into the information fetch register 603 is connected to the information fetch register 603. The radio communicating circuit 602 is provided with an antenna 601 for transmitting/receiving a radio wave. Moreover, the buffer circuit 609 is provided with an external interface 610.

When the data latched by the data latch circuit 612 are fetched into the information fetch register 603, the radio communicating circuit 602 transmits the data fetched into the information fetch register 603 to the outside through the antenna 601.

Consequently, the memory 605 can be caused to directly fetch the stored data into the information fetch register 603, and the operation of the memory 605 can be monitored continuously.

Figure 7:
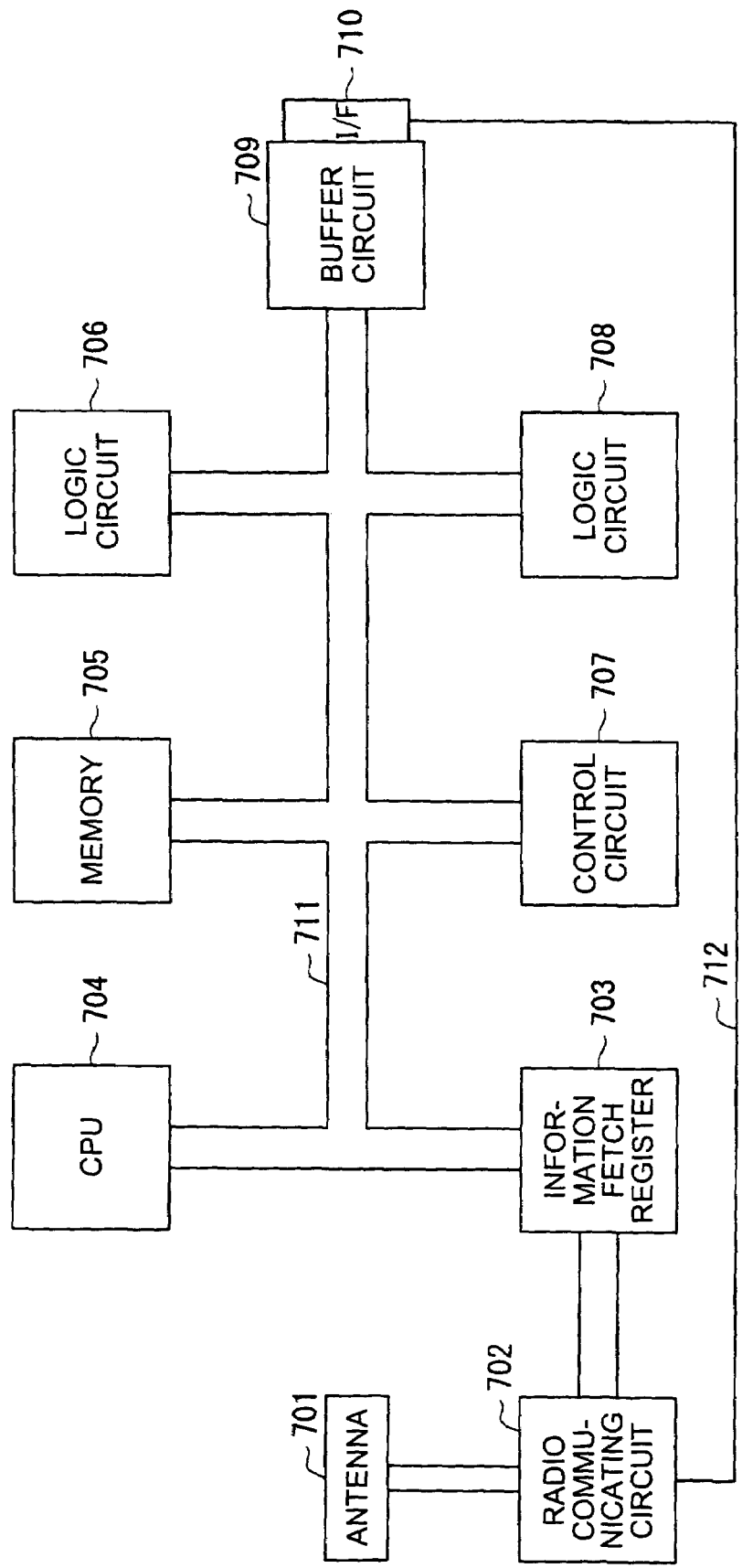
FIG. 7 is a block diagram showing the structure of a semiconductor integrated circuit according to a sixth embodiment of the invention.

FIG. 7 is a block diagram showing the schematic structure of a semiconductor integrated circuit according to a sixth embodiment of the invention.

In FIG. 7, a CPU 704, a memory 705, logic circuits 706 and 708, a control circuit 707 and a buffer circuit 709 are connected to each other through a bus 711. An information fetch register 703 for fetching data flowing over the bus 711 is connected to the bus 711, and a radio communicating circuit 702 for wirelessly transmitting the data fetched into the information fetch register 703 is connected to the information fetch register 703. The radio communicating circuit 702 is provided with an antenna 701 for transmitting/receiving a radio wave. Moreover, the buffer circuit 709 is provided with an external interface 710. Moreover, the radio communicating circuit 702 is connected to the external interface 710 through a wire 712. Additional information accompanying a radio communication to be carried out by the radio communicating circuit 702 can be transmitted to the radio communicating circuit 702 by a wire. Examples of the additional information include an encryption key and authentication information.

In the case in which a semiconductor integrated circuit is to be checked, the encryption key can be sent to the radio communicating circuit 702 through the wire 712, for example. When the data flowing over the bus 711 are fetched into the information fetch register 703, the radio communicating circuit 702 encrypts the data fetched into the information fetch register 703 by using the encryption key and transmits the encrypted data to the outside through the antenna 701.

Consequently, it is possible to transmit the encryption key to the radio communicating circuit 702 by the wire 712. Thus, it is possible to prevent the encryption key from being read by other people. Therefore, it is possible to monitor a large amount of information in real time while maintaining security in a radio communication.

While the description has been given to the method of providing only one antenna in a semiconductor integrated circuit in the embodiments, two antennas may be provided in the semiconductor integrated circuit to carry out a transmission/receipt at the same time.

What is claimed is:

1. A semiconductor integrated circuit comprising:
   a circuit function section;
   a bus connected to the circuit function section;
   an information fetch register for fetching data flowing over the bus;
   a buffer circuit connected to the bus and having an external interface;
   a radio communicating circuit; and
   a wire connecting the radio communicating circuit with the external interface, an encryption key being transmitted from the external interface to the radio communicating circuit by the wire;
   the radio communicating circuit encrypting the data fetched into the information fetch register using the encryption key and wirelessly transmitting the encrypted data.

2. The semiconductor integrated circuit according to claim 1, wherein the radio communicating circuit includes a control information receiving section for receiving control information to give an instruction for fetching data into the information fetch register.

3. The semiconductor integrated circuit according to claim 1, further comprising a wire communicating section for transmitting by the wire additional information accompanying a radio communication to be carried out in the radio communicating circuit.

* * * * *